United States Patent
Najafi et al.

(10) Patent No.: US 6,499,354 B1
(45) Date of Patent: Dec. 31, 2002

(54) METHODS FOR PREVENTION, REDUCTION, AND ELIMINATION OF OUTGASSING AND TRAPPED GASES IN MICROMACHINED DEVICES

(75) Inventors: Nader Najafi, Ann Arbor, MI (US); Sonbol Massoud-Ansari, Ann Arbor, MI (US); Srinivas Tadigadapa, Ann Arbor, MI (US); Yafan Zhang, Ann Arbor, MI (US)

(73) Assignee: Integrated Sensing Systems (ISSYS), Inc., Ypsilanti, MI (US)

( * ) Notice: Subject to any disclaimer, the term of this patent is extended or adjusted under 35 U.S.C. 154(b) by 0 days.

(21) Appl. No.: 09/304,930

(22) Filed: May 4, 1999

Related U.S. Application Data (60) Provisional application No. 60/084,086, filed on May 4, 1998.

(51) Int. Cl.[7] .................................................. G01L 9/00
(52) U.S. Cl. ........................................................ 73/723
(58) Field of Search ...................... 73/723–727, 514.32, 73/514.33

(56) References Cited

U.S. PATENT DOCUMENTS 5,214,346 A * 5/1993 Komatsu
5,701,008 A * 12/1997 Ray et al.

OTHER PUBLICATIONS

M. Esashi, "Micromachining for Packaged Sensors", No date.
K. Minami, T. Moriuchi, M. Esashi, "Cavity Pressure Control for Critical Damping of Packaged Micro Mechanical Devices," pp. 240–243, Jun. 1995.

* cited by examiner

Primary Examiner—Robert R. Raevis
(74) Attorney, Agent, or Firm—Brinks Hofer Gilson & Lione (57) ABSTRACT

Unwanted gasses created during bonding within micromachined vacuum cavities are reduced in a manner conducive to mass manufacturing. Two broad approaches may be applied separately or in combination according to the invention. One method is to deposit a barrier layer within the cavity (for example, on an exposed surface of the substrate). Such a layer not only provides a barrier against gases diffusing out of the substrate, but is also chosen so as to not outgas by itself. Another approach is to use a material which, instead of, or in addition to, acting as a barrier layer, acts as a getterer, such that it reacts with and traps unwanted gases. Incorporation of a getterer according to the invention can be as straightforward as depositing a thin metal layer on the substrate, which reacts to remove the impurities, or can be more elaborate through the use of a non-evaporable getter in a separate cavity in gaseous communication with the cavity. The invention is applicable to a wide range of micromachined devices and structures, including micromachined capacitive pressure sensors and other transducers, though the techniques are not limited to such applications. Anodic bonding is used in conjunction with a glass substrate, with the understanding that various types of substrates and bonding/attachment procedures may alternatively be used.

50 Claims, 10 Drawing Sheets

METHODS FOR PREVENTION, REDUCTION, AND ELIMINATION OF OUTGASSING AND TRAPPED GASES IN MICROMACHINED DEVICES

REFERENCE TO RELATED APPLICATION

This application claims priority of U.S. provisional application Ser. No. 60/084,086, filed May 4, 1998, the entire contents of which are incorporated herein by reference.

This invention was made with Government support under Contract F30602-97-2-0105 awarded by the U.S. Air Force. the Government has certain rights in this invention.

FIELD OF THE INVENTION

This invention relates generally to microdevices, including micromachined capacitive pressure sensors and, in particular, to the prevention, reduction and elimination of outgassing and trapped gases in such devices.

BACKGROUND OF THE INVENTION

Micromachined sensors have been under intense development during the last two decades, and many devices have been developed and commercially produced. Silicon-based pressure sensors, in particular, are being sold worldwide in very large volumes, and are being used in a wide variety of application areas, including automotive and industrial processing.

As part of the fabrication process for the development of vacuum referenced micromachined transducers, attachment of silicon to a substrate, (for example, bonding silicon to glass substrates) in vacuum is required. Various attachment procedures include, but are not limited to, anodic bonding, fusion bonding, thermal bonding, eutectic bonding, glass frit bonding (thermal compression bonding), adhesive bonding and chemical bonding.

Creating ultra high vacuum levels inside micromachined cavities is, however, a problem. For example, even though anodic bonding can be done in very high vacuum levels (for example $10^{-6}$ torr), the pressure inside the vacuum bonded cavities is generally much higher (up to a few orders of magnitude higher). This suggests that there might be at least two residual gas sources which contribute to this lack of ultra high vacuum sealing of transducers. One source is gas generation during the bonding process, and the other source is gas desorption from the inner surface of the sealed cavity. Therefore, in order to create high vacuum in cavities, these gas sources must be eliminated.

SUMMARY OF THE INVENTION

This invention is directed to both preventing outgassing and the elimination of gases created during attachment inside vacuum cavities.

In general terms, this invention is directed toward the prevention of outgassing and/or the elimination of gases created during attachment inside micromachined vacuum cavities. In the preferred embodiment, such problems are solved in a manner which is mass manufacturable.

Specifically, the invention resides in two broad approaches to the problem of sealing ultrahigh vacuum cavities, which can be applied separately or in combination. One method is to deposit a barrier layer within the cavity (for example, on an exposed surface of the substrate). Such a layer not only provides a barrier against gases diffusing out of the substrate, but is also chosen so as to not outgas by itself.

Another approach is to use a material which, instead of, or in addition to, acting as a barrier layer, acts as a getterer, such that it reacts with and traps unwanted gases.

Incorporation of a getterer according to the invention can be as straightforward as depositing a thin metal layer on the substrate, which reacts to remove the impurities, or can be more elaborate through the use of a non-evaporable getter in a separate cavity in gaseous communication with the cavity.

As discussed in the detailed description which follows, the invention is applicable to a wide range of micromachined devices and structures, including micromachined pressure sensors and other transducers, though the techniques are not limited to such applications. In the preferred embodiment, anodic bonding is used in conjunction with a glass substrate, with the understanding that various types of substrates and bonding/attachment procedures may alternatively be used.

DETAILED DESCRIPTION OF THE INVENTION

It should be noted that for simplicity and clarification, in this disclosure we focus on anodic bonding, however, the solutions provided by the invention cover all types of bonding and attachment procedures. Also, the drawings and examples given below are for a micromachined capacitive pressure sensor. The methods mentioned, however, are not limited to this device and can encompass a wide range of micromachined devices.

Figure 1A:
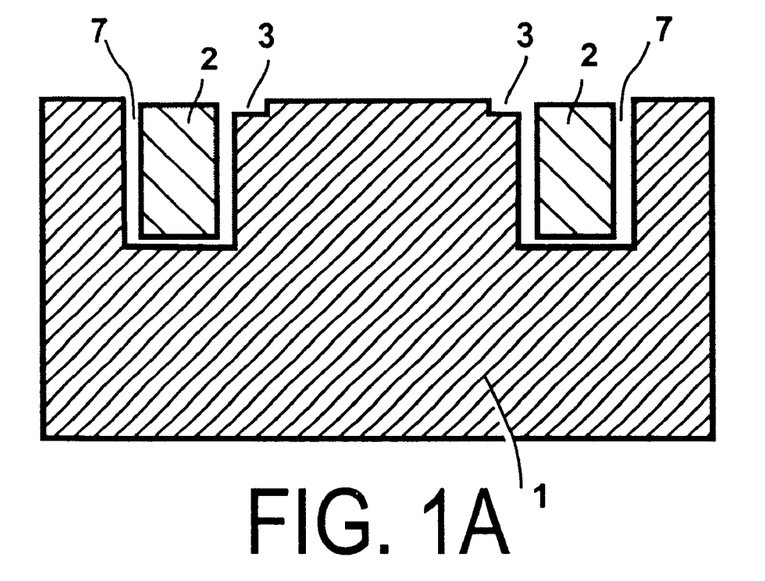
FIG. 1A illustrates a substrate having gettering material placed inside a cavity.

FIGS. 1A through 1E describe the incorporation of a getter material 2 in a micromachined device in order to absorb any gases that have been generated or trapped inside the vacuum cavity. In this approach, a separate cavity 7 for holding the gettering material is machined in the sensor substrate 1 (for example a glass substrate), as shown in FIG. 1A. The advantage of having the cavity in glass or other substrates is that deep cavities can be machined very easily in glass or ceramic substrates in a low cost manner. Also, since the cavity 7 is machined in the substrate 1, there is no need to worry about compatibility issues with the silicon micromachining process.

A material 2 with gettering properties specific to gases in the vacuum cavity can be placed inside the getter cavity 7. For example, if oxygen exists inside the device cavity, a metal such as titanium or chromium can be deposited in a separate getter cavity. A small tunnel 3 is fabricated in the glass or silicon or both, which links the cavity 7 holding the gettering material to the sensor cavity 4.

Alternatively, instead of depositing a gettering material inside the gettering cavity 7, a non-evaporable getter 2 can be placed inside the gettering cavity 7. In order to accomplish this, a metal base, for example nickel, can be either deposited or electroplated inside the gettering cavity. The gettering material is then deposited on the metal base, with the desired thickness. In this method, deposition of the gettering material is incorporated as part of the device fabrication process. A small tunnel 3 is fabricated in the glass or silicon, which links the cavity holding the gettering material to the sensor cavity. It should be noted that if necessary, the gettering material 2 can also be serially placed inside the glass cavity 7 using a high-throughput pick and place machine. For example, pieces of non-evaporable gettering materials can be bought with a specific dimension and a pick and place machine can be used to place the gettering material inside cavities etched in the glass substrate.

Figure 1B:
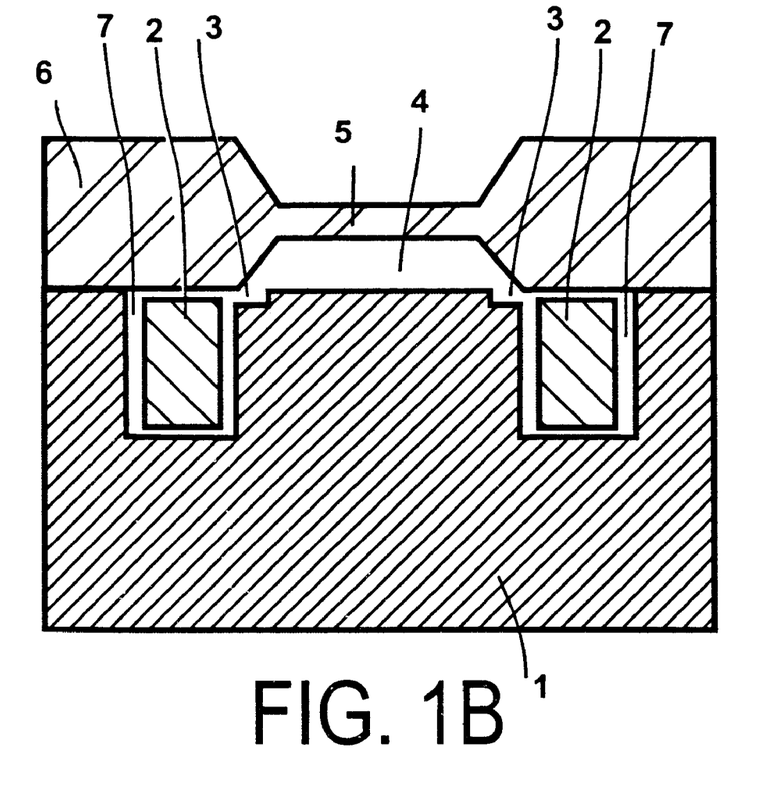
FIG. 1B illustrates a micromachined structure with gettering material placed inside a cavity in the substrate.

The silicon rim 6 is then anodically bonded to the glass substrate 1 in order to fabricate the microstructure, as shown in FIG. 1B. The anodic bonding can be done in vacuum, in air, or in an inert gas atmosphere (e.g., argon). The gettering material 2 can be activated either before, during, or after the anodic bonding step. The activation can also be performed in a combination of heating cycles before, during and after the bonding steps. If the anodic bonding is done in vacuum, then the gettering material 2 can go through a pre-bonding activation step, in order to desorb any gases inside the getter. For example, the getter 2 can be heated for a few hours in vacuum, before bonding takes place. In addition, if the getter 2 is chosen such that the activation temperature is close to the temperature at which anodic bonding takes place, the getter activation can be accomplished during the anodic bonding step. An additional activation step can also be added after the bonding has taken place.

Figure 1C:
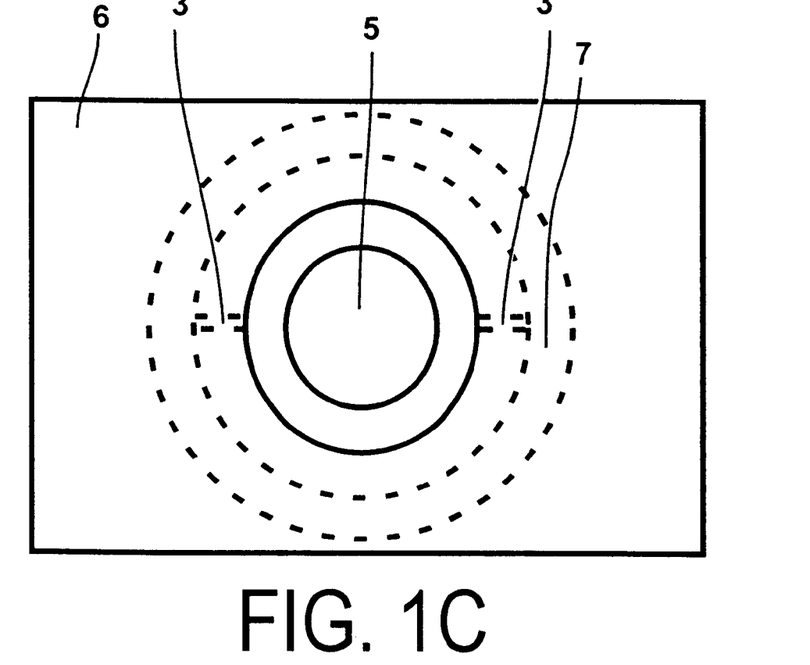
FIG. 1C shows the top view of a micromachined structure with gettering material placed inside a ring shaped cavity in the substrate.
Figure 1D:
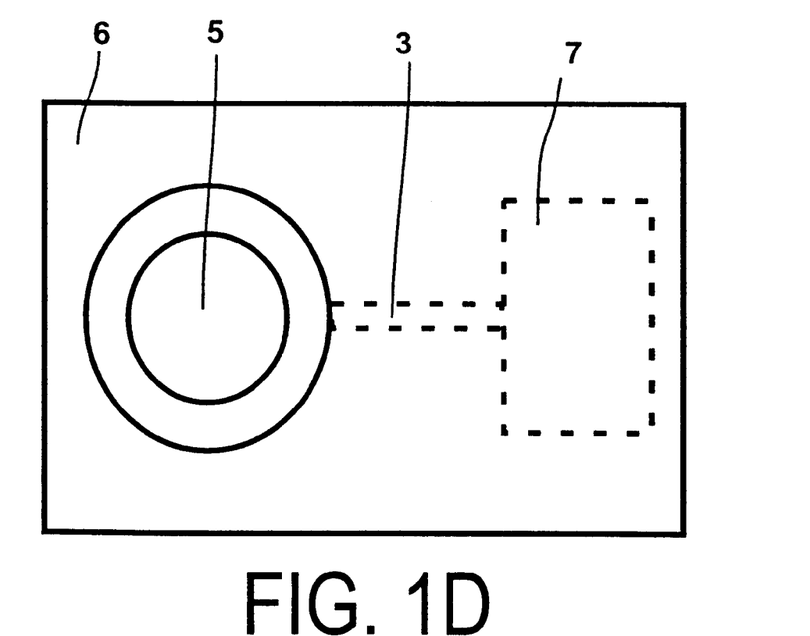
FIG. 1D shows the top view of a micromachined structure with gettering material placed inside a cavity in the substrate.

A top view of FIG. 1B is shown below in FIG. 1C. In this configuration, the gettering cavity 7 is designed as a ring around the sensor cavity 4, and is connected to the sensor cavity 4 with tunnels 3 etched either in the silicon or the substrate 1. This configuration allows for a large amount of gettering material 2 to be deposited in the cavity, without consuming too much area on the total device die. A variety of other configurations can also be used for placing the gettering cavity on the die and connecting it to the sensor cavity. For example, a gettering cavity 7 can be created on one or both sides of the sensor cavity 4, and connected to the sensor cavity 4 through tunnels 3, as shown in FIG. 1D.

Figure 1E:
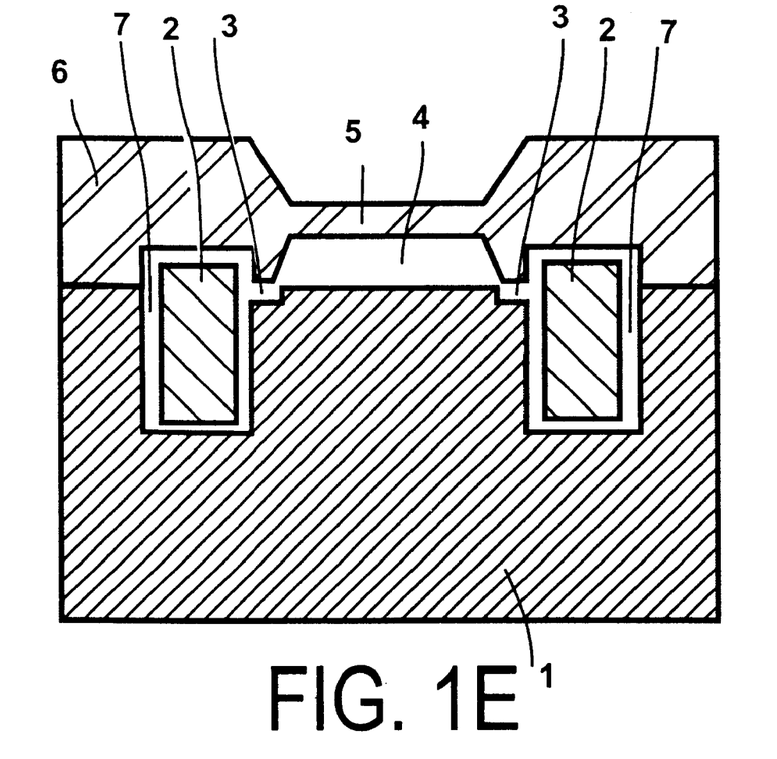
FIG. 1E illustrates a micromachined structure where both the silicon and substrate have a cavity into which the gettering material can be placed.

A slight modification of the above mentioned configuration is shown in FIG. 1E. In this configuration, the silicon also has a cavity which matches and is aligned to the cavity 7 in the glass 1, which holds the gettering material 2. The thickness of the gettering material 2, in this case, is larger than the thickness of the cavity 7 in glass. The gettering material 2 is deposited inside the cavity 7 in glass, and the silicon rim 6 is bonded to the glass substrate 1. A tunnel 3 can be fabricated either in the glass substrate 1, or in the silicon in order to connect the gettering material cavity 7 to the sensor cavity 4.

Figure 2A:
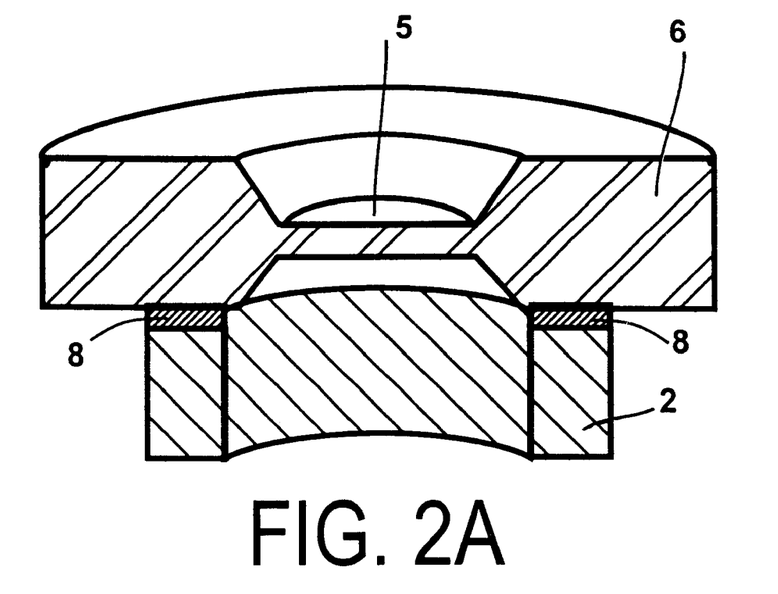
FIG. 2A illustrates a gettering material deposited on a metal base which is attached to the silicon rim of a micromachined structure.

Another method includes placing the gettering material 2 on the silicon rim 6 of the device, as shown in FIG. 2A. For example, if oxygen is the gas inside the device cavity, a metal such as titanium or chromium can be deposited on the silicon rim, in order to act as a getter. In the case of using non-evaporable getters such as Zr—Va—Fe, a metal base 8, for example nickel, can be either deposited or electroplated on the silicon rim 6. The gettering material 2 is then deposited on the metal base 8, with the desired thickness.

Figure 2B:
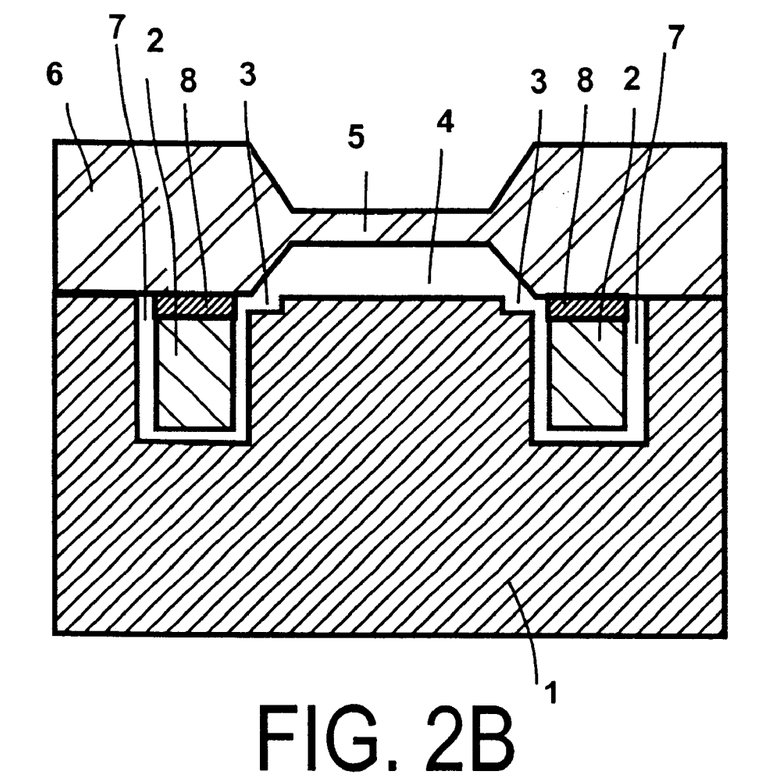
FIG. 2B illustrates, with reference to FIG. 2A, the cross section of the micromachined device with gettering material deposited on a metal and attached to the silicon rim.

A cross section of the bonded device is shown in FIG. 2B. A cavity 7 is created in the glass substrate 1, and the glass substrate 1 is anodically bonded to the silicon rim 6. It is better if the getter deposition step be the last processing step before anodic bonding. A tunnel 3 can be created either in the glass substrate 1 or the silicon rim 6, which allows the gas inside the sensor cavity to be exposed to the gettering material.

Figure 3A:
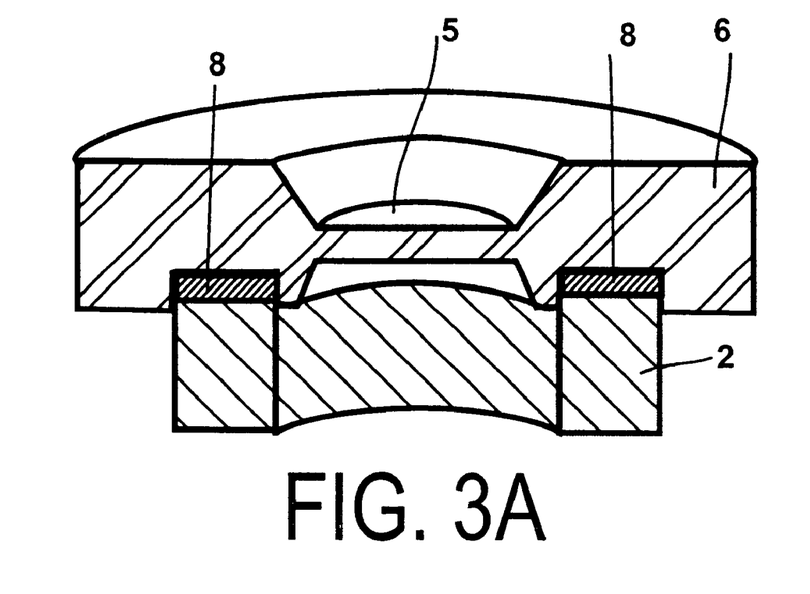
FIG. 3A shows gettering material deposited on a metal base inside a cavity, on the silicon rim of a micromachined structure.

FIG. 3A shows a slight variation on the above mentioned process. In this case, a cavity is created in the silicon rim 6. A metal base 8, for example nickel, is deposited or electroplated inside the cavity. The gettering material 2 is then deposited on the metal base 8. It should be noted that the depth of the cavity can either be the same as the thickness of the gettering material 2 or less. If the depth of the cavity in the silicon rim 6, is less than the thickness of the gettering material 2, then a cavity also needs to be created in the glass substrate.

Figure 3B:
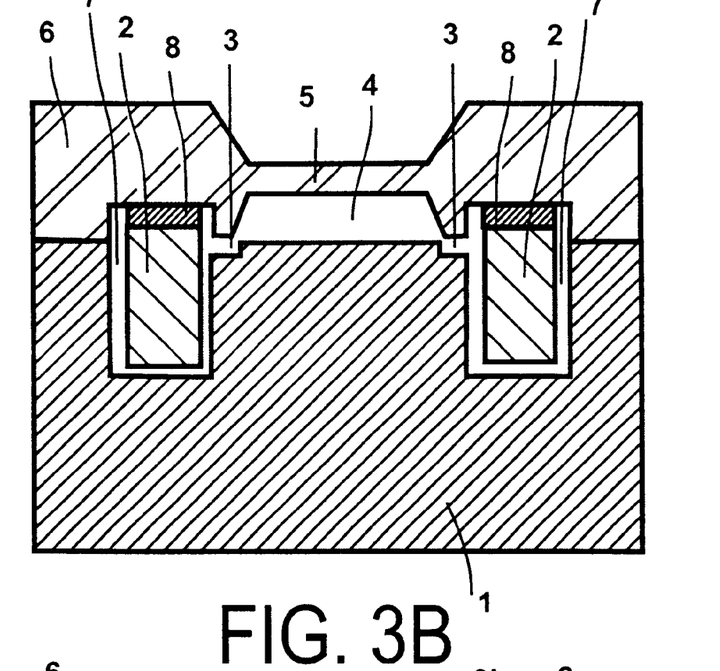
FIG. 3B illustrates, with reference to FIG. 3A is a cross section of a micromachined device, where the gettering material is deposited on a metal base, inside a cavity on the silicon rim of the device.

FIG. 3B shows a cross section of the device after the glass 1 has been bonded to the silicon rim 6. The depth of the cavity in the silicon is less than the thickness of the gettering material 2, therefore a matching cavity 7 has been formed in the glass substrate 1. As mentioned before, a tunnel 3 should be created in either the glass 1 or the silicon rim 6, in order to expose the gas inside the sensor cavity 4 to the gettering material 2.

Figure 4:
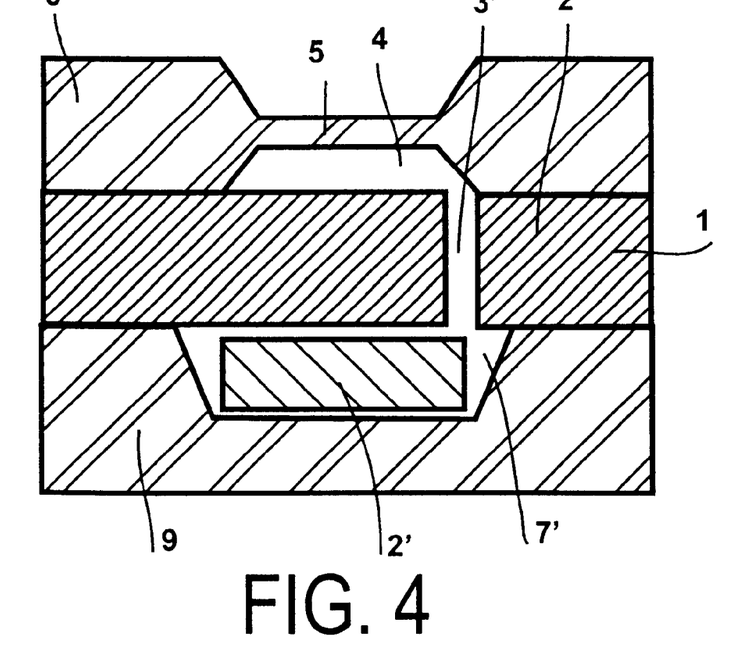
FIG. 4 illustrates the cross section of a micromachined device, where gettering material is placed inside a cavity in the backside silicon substrate.

A different approach to incorporating gettering material in micromachined devices is shown in FIG. 4. In this approach, a third substrate 9, for example a second silicon wafer is bonded to the glass substrate 1. The second silicon substrate 9 has a cavity 7' which holds the gettering material 2'. A through hole 3' is created in the glass substrate 1, which connects the sensor cavity 4, to the cavity 7' holding the gettering material 2' in the second silicon substrate 9. The gettering material 2' can be placed inside the cavity 7' in the second silicon wafer 9 using a variety of approaches, for example the gettering material can be serially placed inside the second silicon substrate, immediately before bonding. Alternatively, the gettering material can be placed using either screen printing, or deposition techniques such as evaporation and sputtering.

Figure 5:
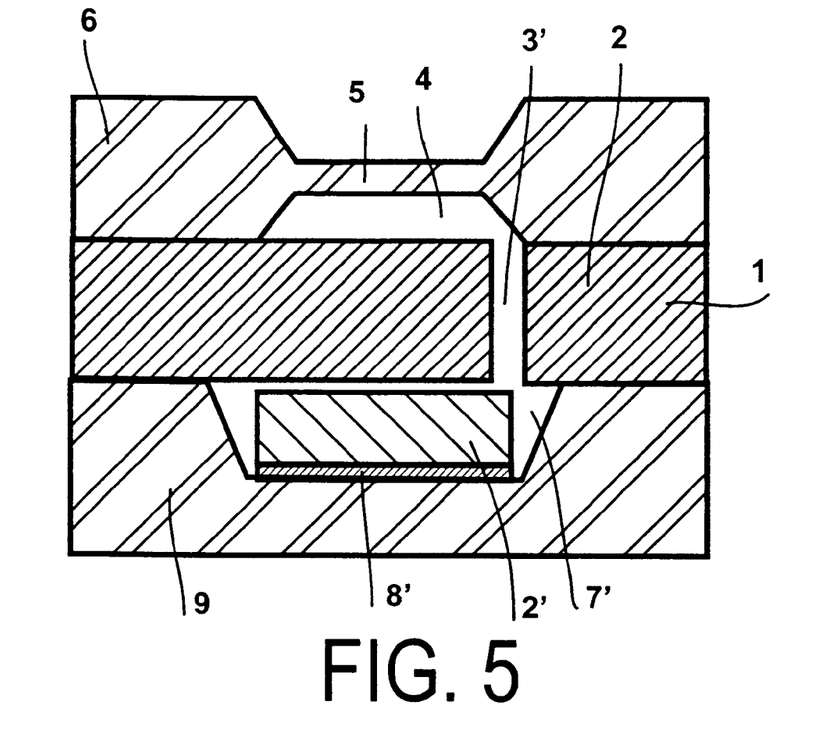
FIG. 5 illustrates the cross section of a micromachined device, where gettering material is deposited on a metal base, inside a cavity in the backside silicon substrate.

In another approach, a metal base 8' can be either deposited or electroplated inside the cavity 7' of the bottom silicon substrate 9. The gettering material 2' can then be placed on the metal base 8', as shown in FIG. 5. Alternatively, a metal that has gettering properties specific to gases inside the cavity can be deposited directly on the second silicon substrate 9. Using this method, the step of adding gettering material to the device can become mass producible.

In all the cases mentioned in this invention, the gettering material needs to be activated by heating the getter in vacuum to a specified temperature, for a specified amount of time. Activation of the gettering material is normally done by either heating the gettering material separately before insertion into the device, or by heating the substrate to which the gettering material is attached. A wide variety of heating methods can be used for activating the getter material, including but not limited to direct heating in a furnace, microwave heating, plasma heating and rf heating. An innovative method for activating the getters can also be developed, in which a dynamic activation process, is used via an embedded micro hot-plate. Using this method, a current can be applied to the micro hot-plate in order to heat and activate the getter. This activation can be performed periodically (for example, once a month if needed).

Figure 6:
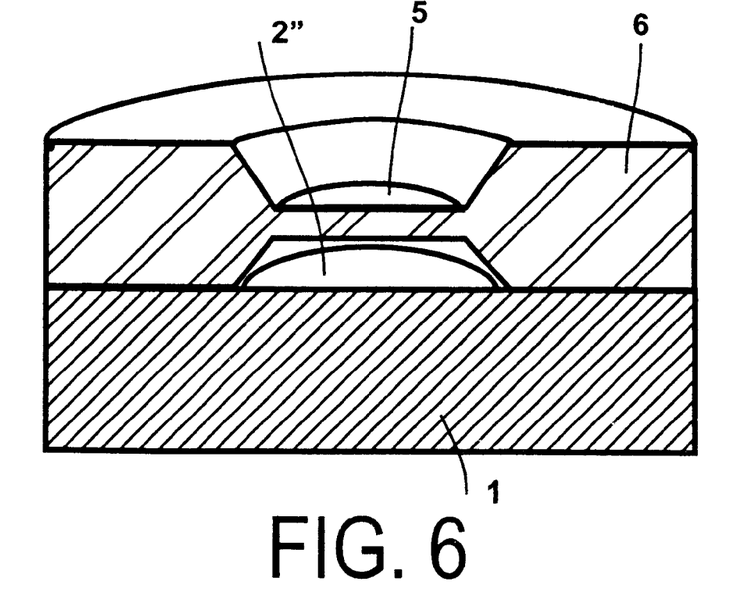
FIG. 6 shows a perspective view of a micromachined device, where a thin metal layer is deposited on the entire substrate area inside the cavity.
Figure 7:
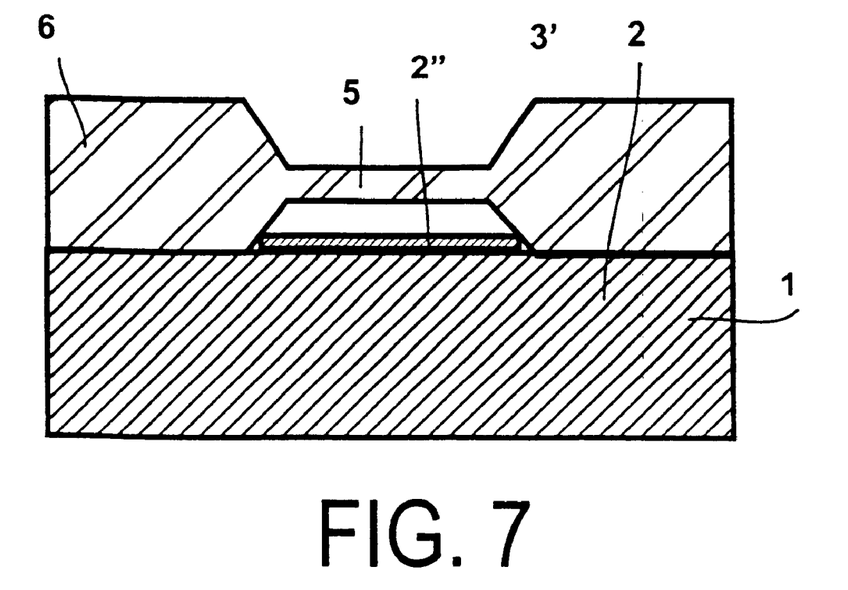
FIG. 7 shows a cross section of a micromachined device where a thin metal layer is deposited on the entire substrate area inside the cavity.

Another method of incorporating a gettering material into micromachined devices is to deposit a thin layer of a metal 2" on the portion of the substrate which is inside the cavity, either completely or partially covering. This is shown in FIGS. 6 and 7. This metal layer 2" needs to react with the gases generated inside the cavity 4, and thus, act as a getterer. For example, a thin layer of titanium or chromium can be deposited on the substrate 1, and react with oxygen that is generated during anodic bonding process, in order to form titanium oxide or chromium oxide. It should be noted that specific metals should be selected for gettering of specific gases inside a micromachined device. It should be noted, that if necessary, the gettering material 2" can also be deposited on the portion of the silicon wafer that is inside the cavity 4.

A similar method as described above can be used for providing a barrier layer against outgassing of the substrate. For example, a thin layer of metal 2" can be deposited on the entire glass area which is inside the cavity. This metal layer 2" can act as a barrier against any gases that come out of the substrate 1. In addition, specific metals can be used that not only can act as a barrier layer, but can also act as a getterer for any gases that desorb from the glass.

An alternative approach to this problem is to have a cavity in the substrate, and to deposit the metal layer inside the cavity, such that the thickness of the metal is very close to the depth of the cavity. This allows the metal to completely cover the substrate, and may even allow for a small overlap onto the bonded area. Having the cavity in glass ensures that no step height difference exists between the silicon and the metal covered portion of the substrate, which allows for better bonding. This method also ensures that the entire surface of the substrate is covered in order to eliminate outgassing of the substrate.

It should be noted that this method for prevention and elimination of outgassing is not limited to use of only one metal layer. Two or more metal layers can be deposited on the entire substrate area in order to act as a barrier against outgassing, and in some cases, in addition to acting as a barrier layer, also be a getterer for any gases that either exist in the cavity, or desorb from the class. In addition, one or more dielectric layers can be deposited before or after the metal layers in order to act as additional barriers against outgassing of the substrate. If necessary, metal layers can also cover the portion of the silicon that is inside the cavity.

Figure 8A:
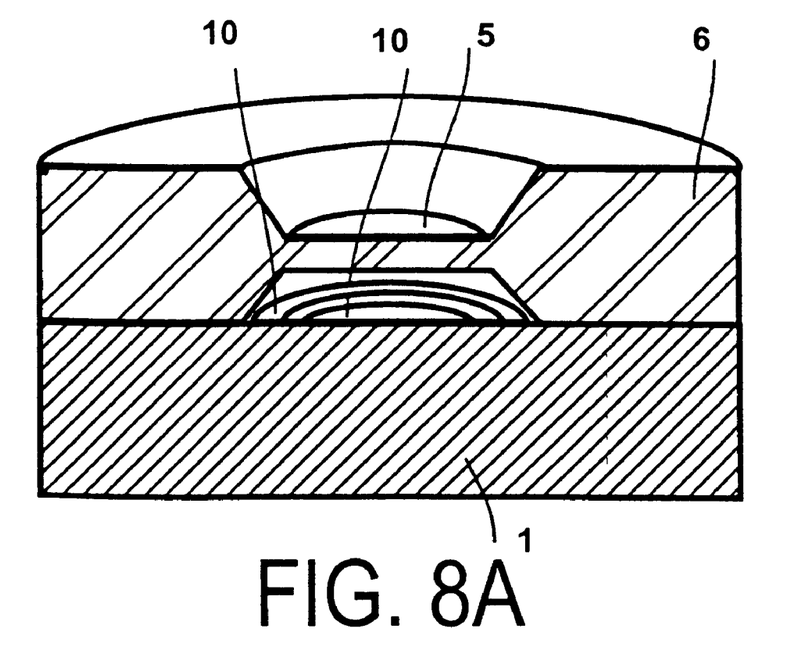
FIG. 8A shows top view of a micromachined device with metal plates on the substrate.

The above mentioned method, will need to be modified for use in capacitive devices where there is one or more capacitive plates inside the cavity. For example in the case of a capacitive ultra-high vacuum pressure sensor, one of the capacitor plates 10, in addition to any reference capacitor plates will be deposited on the substrate 1, inside the sensor cavity 5, as shown in FIG. 8A.

If a metal layer is deposited on the entire glass area, the capacitor plates will be shorted to each other and to the substrate. One method to overcome this problem is to deposit a thin metal layer on top of the capacitor plates, and oxidize it in order to make it an insulating layer. The metal needs to be selected such that the total thickness of the metal can be oxidized, in order to prevent shorting the capacitor plates. Alternatively, a thin metal layer can be first deposited on the substrate area inside the cavity and the entire thickness of the metal can be oxidized. The metal capacitor plates can then be deposited and patterned on top of this layer.

Figure 8B:
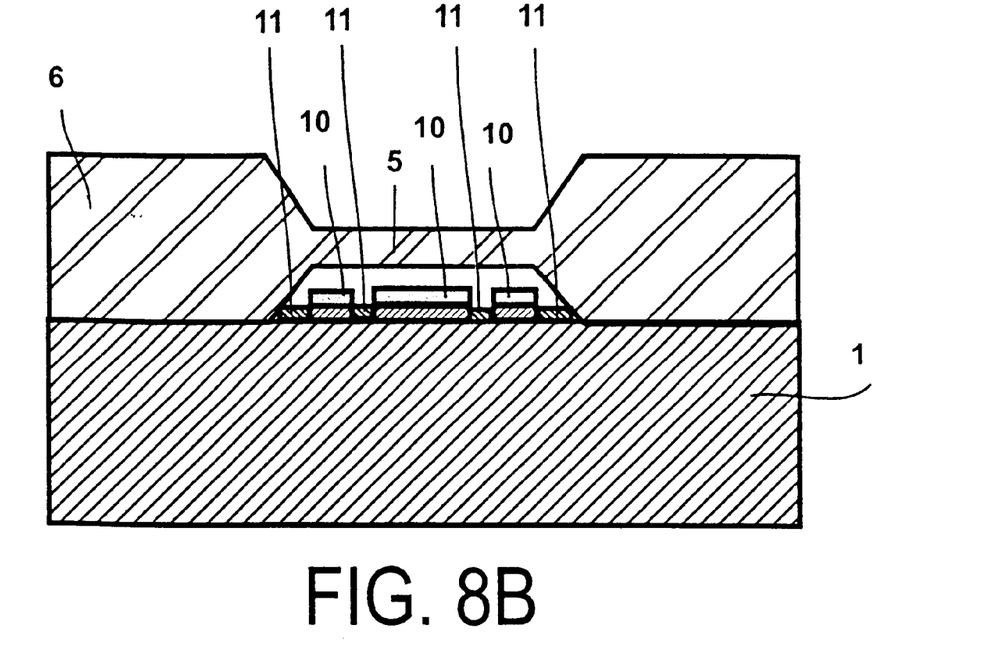
FIG. 8B shows the cross section of a micromachined device with thin metal layer underneath the capacitor plates, in which parts of the metal layer have been oxidized.

Alternatively, the oxidation of the underlying thin metal layer can be done after the capacitor plates are deposited and patterned as is shown in FIG. 8B. For example, a thin titanium layer can be deposited on the entire surface of the substrate inside the cavity, and may even overlap with the areas under the silicon rim. Platinum capacitor plates can be then deposited on this thin titanium layer and patterned. The entire substrate can then go through an oxidation stage where the portions of the titanium 11 that are not covered by platinum will be oxidized and, therefore, prevent the platinum capacitor plates from shorting to each other. Also, if necessary, one or more metal or dielectric layers can be used to cover the portion of the silicon that is inside the cavity.

Figure 9:
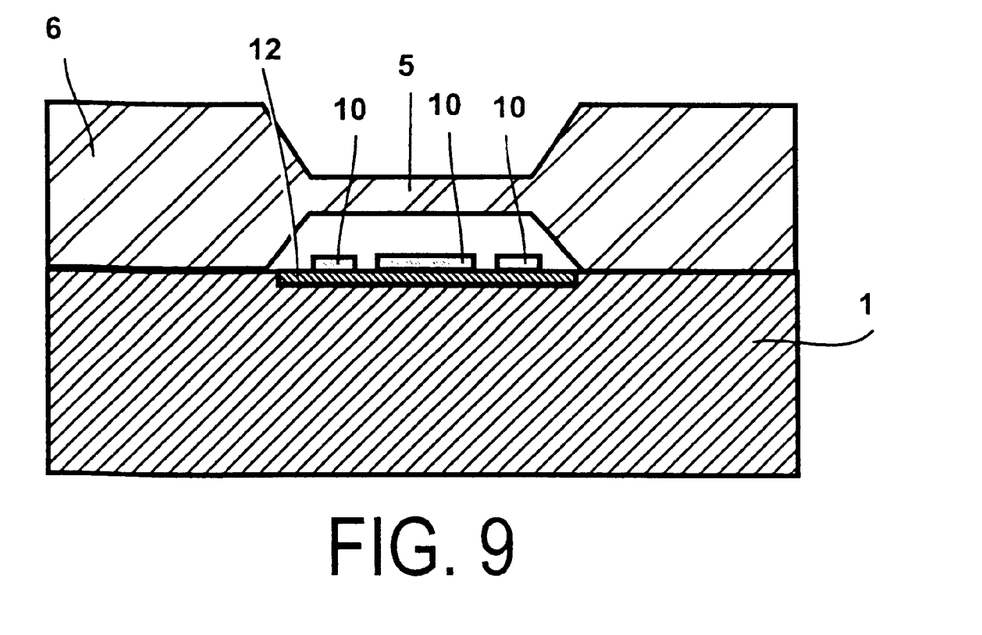
FIG. 9 shows a cross section of a micromachined device where a dielectric layer is deposited on the entire substrate area inside the cavity.

Another method that can be used in order to reduce the outgassing of the substrate, is to use a dielectric film 12 on the entire substrate, as shown in FIG. 9. This dielectric film 12 can be used as a barrier layer against gases coming out of the substrate 1 and into the sensor cavity 4. As in the case of metals acting as barrier layers, a cavity can be etched in the substrate, the dielectric can be deposited on the entire substrate area which is inside the cavity, such that the thickness of the dielectric film is close to the depth of the cavity. The metal capacitor plates 10 can then be deposited on top of this dielectric layer 12. It should also be noted that more than one layer of dielectric films can be used to cover the portion to the substrate that is inside the cavity, and in addition, the dielectric layers may also overlap with the bonded areas under the silicon rim in order to completely cover the substrate. The metal capacitor plates 10 can then be deposited on top of this dielectric layer 12. It should also be noted that if necessary, one or more metal or dielectric layers can be used to cover the portion of the silicon that is inside the cavity.

The above mentioned method can also be used for non-capacitive devices. In these devices, the dielectric layer can cover the entire surface of the substrate inside the vacuum cavity. As mentioned in the previous cases, a cavity can also be etched in the substrate and the dielectric film can be deposited in the cavity. Also one or more layers of either the same or different dielectric films can be deposited on the substrate, and used as barrier layers against outgassing. In addition, one metal layer and one dielectric layer, or combined multi-layers of metals and dielectrics can be used in order to both act as barrier layers and getterers for any outgassing that might occur from the glass. All of these configurations may be deposited in a manner that they overlap slightly with the area of the substrate that will be bonded to the silicon rim.

Figure 10:
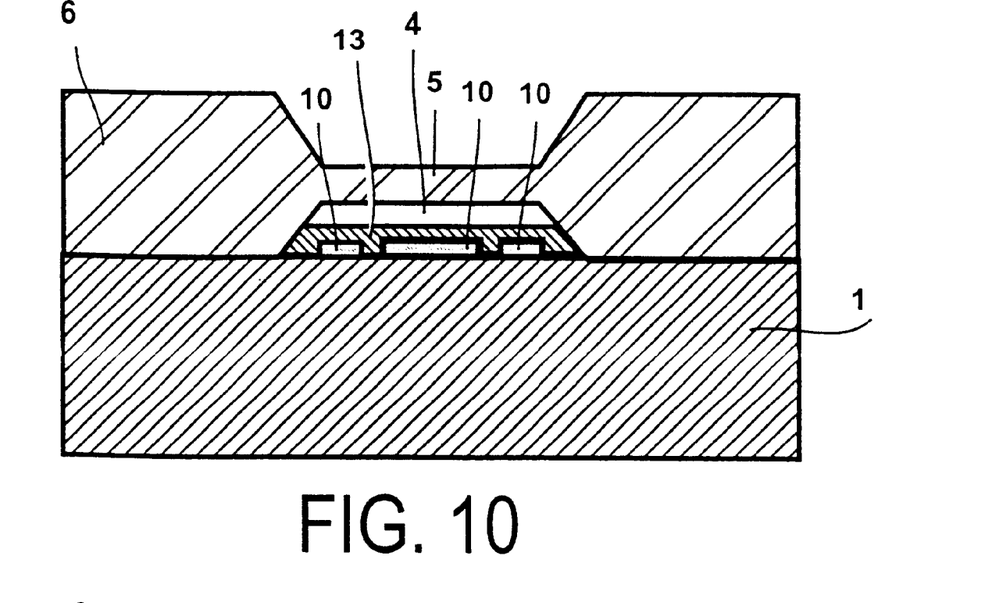
FIG. 10 shows the cross section of a micromachined device with a dielectric layer deposited on top of the metal plates.

Another method for reduction and elimination of outgassing from the substrate of a high vacuum, capacitive micromachined device is shown in FIG. 10. This method consists of depositing a layer of an insulating film 13 over the metal capacitor plates 10, on part or all of the area of the substrate 1 which is inside the cavity 4. It is better if this dielectric layer 13 is conformal in order to completely cover the metal plates 10. For example, the metal plates 10 for the capacitors can be first deposited on the substrate 1, then a dielectric layer 13 can be deposited in a way that it covers both the metal lines and the remaining areas of the substrate that is inside the cavity. If the thickness of the dielectric layer is small enough, part of the dielectric layer 13 on the substrate can overlap with the portion of the substrate area that will be bonded to the silicon. In addition, two or more dielectric films can be deposited on the metal plates and surrounding substrate area in order to act as a barrier layer against any gases diffusing out of the substrate and into the cavity. Also, as mentioned in all the previous cases, one or more metal or dielectric layers can be used to cover the portion of the silicon that is inside the cavity.

Figure 11:
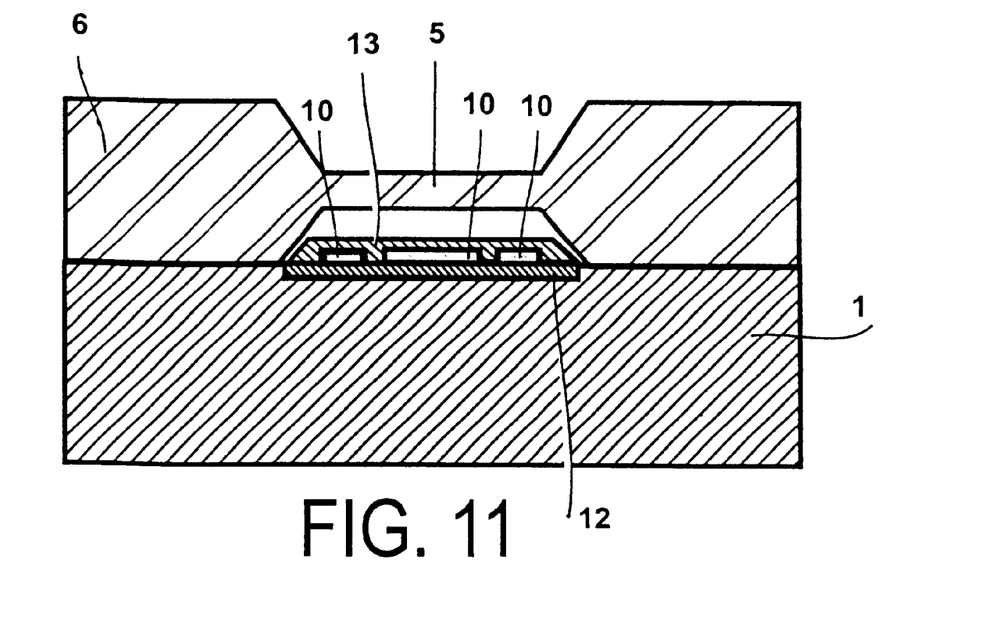
FIG. 11 illustrates the cross section of a micromachined device with a dielectric layer deposited on top of the metal plates and a second dielectric layer beneath the metal plates.

In another configuration of what is discussed above, in addition to having a dielectric layer 13 deposited on the entire metal plates 10 and the substrate area surrounding the plates, another dielectric layer 12 can be initially deposited on glass 1. For example, one can deposit a dielectric layer 12 on glass 1 (either on the surface or in a cavity in the glass), deposit and pattern the metal plates 10, and finally deposit one or more layers of dielectric films 13 on the entire area. It should be noted that the dielectric that is deposited on top of the metal can be different than the first dielectric deposited on the entire glass surface. Also part of one or both of the dielectric layers can overlap with the portion of the substrate area that will be bonded to the silicon. This method is illustrated in FIG. 11. Also, if necessary, one or more metal or dielectric layers can be used to cover the portion of the silicon that is inside the cavity.

Figure 12A:
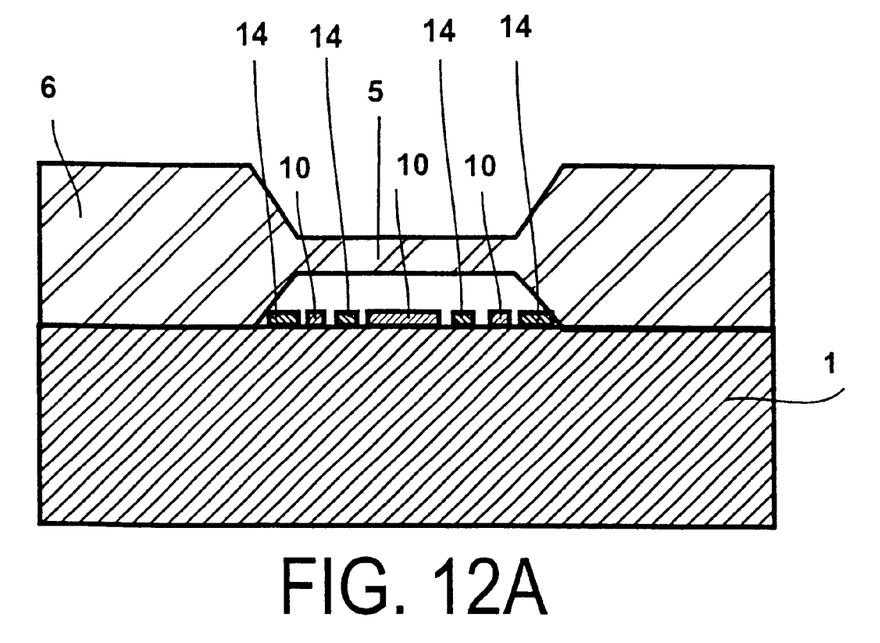
FIG. 12A shows the cross section of a micromachined capacitive device with capacitor plates and dummy metal plates covering the substrate.

Another method for preventing outgassing of the substrate in a capacitive micromachined device is shown in FIG. 12A. This method involves depositing and patterning capacitor metal plates 10 on the substrate 1. Also, in addition to the capacitor plates 10, dummy metal rings 14 are deposited on the remaining portions of the substrate 1. These dummy rings 14 cover the substrate 1 in order to act as a barrier layer against outgassing of the substrate 1, or additionally as a gettering material.

The dummy ring on the perimeter can be extended to the silicon rim 6, in a manner that no glass is exposed and no step coverage exists between the dummy metal rings. For example, a cavity can be etched in the substrate, and the dummy rings and/or the capacitor plates can be deposited and patterned in this cavity. The thickness of the metal rings 14 should be close to the depth of the cavity so that the dummy ring on the perimeter can be extended all the way to the silicon rim, with minimum step height difference between the metal ring and the substrate, in order to allow bonding of the silicon rim 6 to the substrate 1.

It is also possible to choose the dummy metal plates in a manner that they can be heated up and act as getterers for any gases that exist inside the cavity. For example, if oxygen exists inside the device cavity, a current can be passed through the dummy rings in order to heat them up and oxidize them. Of course the thickness of the dummy metal rings should be optimized in order to ensure that the entire thickness of the metal is oxidized.

Figure 12B:
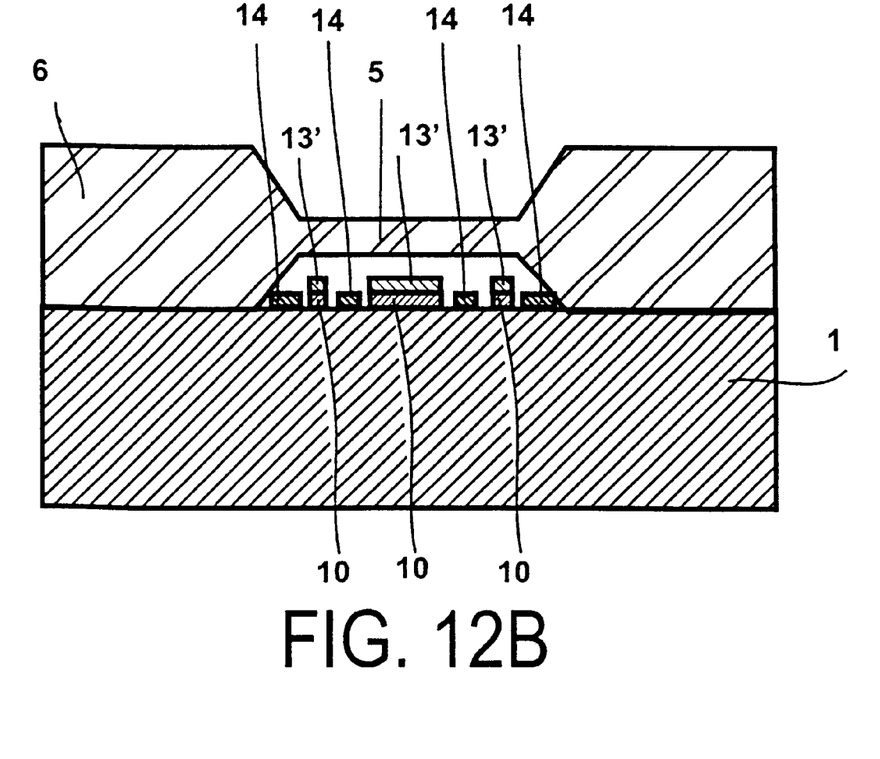
FIG. 12B shows the cross section of a micromachined capacitive device with dielectric layer deposited on the capacitor plates and having metal plates covering the remaining portions of the substrate.

A thin dielectric layer 13' can be deposited on top of the metal capacitor plates 10 and patterned in a manner that it completely covers the capacitor plates 10 while it may or may not cover the dummy metal plates 14, as shown in FIG. 12B. Also, one can initially deposit a dielectric layer on glass (either on the surface or in a cavity in the glass), deposit and pattern the metal plates, and finally deposit one or more layers of. dielectric films on the capacitor plates 10 and optionally on the dummy metal plates 14.

The dielectric that is deposited on top of the metal can be different than the first dielectric deposited on the entire glass surface. Again, one or both of the dielectric layers can be patterned in a manner that they slightly overlap with the portion of the substrate that will be bonded to the silicon rim, in order to ensure that the entire area of the substrate is covered. Also, as mentioned above, one or more metal or dielectric layers can be used to cover the portion of the silicon that is inside the cavity.

For all the cases mentioned above, the combined use of both gettering material and barrier layers can be incorporated in the same device. For example, the device can have barrier layers on the portion of the substrate that is inside the cavity, and have a separate cavity in the substrate for holding the gettering material. The getter cavity can then be connected to the sensor cavity with a tunnel that is etched either in the substrate or the silicon, or both. Various combinations of all the methods for incorporating getterers in the device, and using barrier layers can be used. Some dielectrics that can be used as barrier layers are diamond like carbon films (doped, undoped, diamond like nanocomposites), various nitrides such as silicon nitride, boron nitride, zirconium nitride, titanium nitride, various oxides such as titanium dioxide, titanium monoxide, silicon monoxide, and carbides such as silicon carbide, hafnium carbide, titanium carbide. Also for example, thin films containing mixtures of titanium and titanium monoxide can be used, in which the titanium monoxide acts as a barrier layer and titanium acts as a getterer.

Although this invention is ideally suited to the design, fabrication, and manufacturing of capacitive absolute pressure sensors, in particular for ultra-high-vacuum applications, the teachings set forth herein may be used in many other devices and fields of endeavor, including flow sensors, flow controllers, gyroscopes, accelerometers, yaw sensors, force sensors, diaphragm-type actuators, resonating devices, telecommunication devices (such as mechanical filters, oscillators, etc.), and optical devices such as infrared detectors, CCD cameras, and flat-panel displays. It should also be understood that all terms relating to direction, shape, and geometry, and references to an upper or lower surface (or the inside and outside) of a component are used only as exemplary and are not meant to limit the invention to any particular configuration or to use in any particular orientation.

We claim:

1. A microdevice, comprising:
    a substrate having a first substrate surface;
    a semiconductor microstructure having a first microstructure surface, wherein the semiconductor microstructure is attached along the first microstructure surface to the first substrate surface;
    a sealed cavity defined by the first substrate surface and the first microstructure surface, wherein the sealed cavity is formed within at least a portion of the semiconductor microstructure;
    a getter cavity formed within at least a portion of the substrate and in gaseous communication with the sealed cavity; and
    a material disposed in the getter cavity, the material being operative to perform gettering.

2. The microdevice of claim 1, wherein the getter cavity and the sealed cavity are physically separate from one another and interconnected through a gas-carrying path.

3. The microdevice of claim 1, wherein the getter cavity is embedded within the substrate below the semiconductor microstructure, and wherein the gas-carrying path has a vertical component.

4. The microdevice of claim 3, wherein the substrate is a multilayer substrate, wherein the getter cavity is formed in at least one of the substrate layers and the gas carrying path is formed through at least one of the other layers.

5. The microdevice of claim 1, wherein the substrate is glass, ceramic or silicon.

6. The microdevice of claim 1, wherein the semiconductor microstructure is silicon-based.

7. The microdevice of claim 1, wherein the material is composed of one or more of the following:
    titanium,
    chromium,
    alloys of zirconium or vanadium, including zirconium-vanadium-iron, and
    zirconium graphite.

8. The microdevice of claim 1, wherein the material is an evaporable getter.

9. The microdevice of claim 1, wherein the sealed cavity forms part of a pressure sensor.

10. The microdevice of claim 1, further including a path between the getter cavity and the sealed cavity.

11. The microdevice of claim 1, wherein the semiconductor microstructure is attached to the substrate using one or more of the following techniques:
    anodic bonding,
    fusion bonding,
    thermal bonding,
    eutectic bonding,
    glass-frit bonding,
    thermal compression bonding,
    adhesive bonding, and
    chemical bonding.

12. The microdevice of claim 1, wherein the gettering cavity is coterminous with the sealed cavity.

13. A method of fabricating a microdevice, comprising the steps of:
    providing a substrate;
    attaching a semiconductor microstructure to the substrate to form a sealed cavity, wherein the sealed cavity is formed within at least a portion of the microstructure;
    providing a getter cavity within at least a portion of the substrate, the getter cavity being in gaseous communication with the sealed cavity;
    providing a material in the getter cavity, the material being operative to perform gettering.

14. The method of claim 13, wherein the getter cavity and the sealed cavity are physically separate from one another and interconnected through a gas-carrying path.

15. The method of claim 13, wherein at least a portion of the getter cavity is in direct communication with the sealed cavity.

16. The method of claim 13, wherein the step associated with providing the material includes depositing the material within the getter cavity.

17. The method of claim 13, wherein the step associated with providing the material includes using a pick-and-place machine.

18. The method of claim 13, wherein:
    the material is a getter; and
    the method further includes the step of activating the getter.

19. The method of claim 18, wherein the step of activating the getter occurs after the step associated with attaching the semiconductor microstructure to the substrate.

20. The method of claim 18, wherein the step of activating the getter includes direct heating of the material.

21. The method of claim 20, further including the steps of:
    providing an externally controlled heating element in thermal communication with the material; and
    controlling the element to activate the material.

22. The method of claim 18, wherein the step of activating the getter includes indirect heating of the material.

23. The method of claim 22, wherein the indirect heating of the material includes microwave heating, plasma heating, or RF heating.

24. The method of claim 13, wherein the step of attaching the semiconductor microstructure to the substrate includes the use of one or more of the following techniques:
    anodic bonding,
    fusion bonding,
    thermal bonding,
    eutectic bonding,
    glass-frit bonding,
    thermal compression bonding,
    adhesive bonding, and
    chemical bonding.

25. The method of claim 13, wherein the substrate is a multi-layer substrate, wherein the getter cavity is formed in at least one of the substrate layers and the gas-carrying path is formed through at least one of the other layers.

26. The method of claim 25, wherein some or all of the substrate layers are glass, ceramic or silicon.

27. The method of claim 25, further including the step of separating the material from the substrate with a metallic layer.

28. A microdevice, comprising:
    a substrate having a first substrate surface;
    a semiconductor microstructure having a first microstructure surface, wherein the microstructure is attached along the first microstructure surface to the first substrate surface;

a sealed cavity defined by the first substrate surface and the first microstructure surface;

a getter cavity formed within at least a portion of the substrate and in gaseous communication with the sealed cavity wherein the getter cavity is ring-shaped; and a material disposed in the getter cavity, the material being operative to perform gettering.

29. The microdevice of claim 28, wherein the substrate is glass, ceramic or silicon.

30. The microdevice of claim 28, wherein the semiconductor microstructure is silicon-based.

31. The microdevice of claim 28, wherein the material is a non-evaporable getter.

32. The microdevice of claim 28, wherein the sealed cavity forms part of a pressure sensor.

33. The microdevice of claim 28, wherein the microdevice is a capacitive transducer having a first and second opposing, spaced apart, electrically conductive plates, with the first plate being supported relative to the substrate and the second plate is suspended there above.

34. A microdevice, comprising:

a unitary substrate having a first substrate surface;

a microstructure having a first microstructure surface, wherein the microstructure is attached along the first microstructure surface to the first substrate surface;

a sealed cavity defined by the first substrate surface and the first microstructure surface, wherein the sealed cavity is formed within at least a portion of the microstructure;

a getter cavity formed within at least a portion of the unitary substrate and in gaseous communication with the sealed cavity; and a material disposed in the getter cavity, the material being operative to perform gettering.

35. The microdevice of claim 34, wherein the getter cavity and the sealed cavity are physically separate from one another and interconnected through a gas-carrying path.

36. The microdevice of claim 34, wherein the material is composed of one or more of the following:

titanium, chromium, alloys of zirconium or vanadium, including zirconium-vanadium-iron, and zirconium graphite.

37. The microdevice of claim 34, wherein the material is an evaporable getter.

38. The microdevice of claim 34, wherein the sealed cavity forms part of a pressure sensor.

39. The microdevice of claim 34, further including a path between the getter cavity and the sealed cavity.

40. A method of fabricating a microdevice, comprising steps of:

providing a unitary substrate;

attaching a microstructure to the unitary substrate to form a sealed cavity, wherein the sealed cavity is formed within at least a portion of the microstructure;

providing a getter cavity within at least a portion of the unitary substrate, the getter cavity being in gaseous communication with the sealed cavity;

providing a material in the getter cavity, the material being operative to perform gettering.

41. The method of claim 40, wherein at least a portion of the getter cavity is in direct communication with the sealed cavity.

42. The method of claim 40, wherein the step associated with providing the material includes depositing the material within the getter cavity.

43. The method of claim 40, wherein the step associated with providing the material includes using a pick-and-place machine.

44. The method of claim 40, wherein:

the material is a getter; and the method further includes the step of activating the getter.

45. The method of claim 44, wherein the step of activating the getter occurs after the step associated with attaching the microstructure to the unitary substrate.

46. The method of claim 44, wherein the step of activating the getter includes direct heating of the material.

47. The method of claim 46, further including the steps of:

providing an externally controlled heating element in thermal communication with the material; and controlling the element to activate the material.

48. The method of claim 44, wherein the step of activating the getter includes indirect heating of the material.

49. The method of claim 48, wherein the indirect heating of the material includes microwave heating, plasma heating, or RF heating.

50. The method of claim 40, wherein the step of attaching the microstructure to the unitary substrate includes the use of one or more of the following techniques:

anodic bonding, fusion bonding, thermal bonding, eutectic bonding, glass-frit bonding, thermal compression bonding, adhesive bonding, and chemical bonding.

* * * * *